(12) United States Patent
Georges et al.

(10) Patent No.: US 6,783,621 B1
(45) Date of Patent: Aug. 31, 2004

(54) METHOD OF MANUFACTURING A THERMOSTRUCTURAL COMPOSITE MATERIAL BOWL, IN PARTICULAR FOR AN INSTALLATION THAT PRODUCES SILICON SINGLE CRYSTALS

(75) Inventors: Jean-Michel Georges, Blanquefort (FR); Daniel Benethuiliere, St. Medard En Jalles (FR); Eric Philippe, Merignac (FR)

(73) Assignee: SNECMA Moteurs, Paris (FR)

( * ) Notice: Subject to any disclaimer, the term of this patent is extended or adjusted under 35 U.S.C. 154(b) by 20 days.

(21) Appl. No.: 09/889,860

(22) PCT Filed: Nov. 24, 2000

(86) PCT No.: PCT/FR00/03275

§ 371 (c)(1),
(2), (4) Date: Jul. 23, 2001

(87) PCT Pub. No.: WO01/38255

PCT Pub. Date: May 31, 2001

(30) Foreign Application Priority Data

Nov. 24, 1999 (FR) .............................................. 99 14766

(51) Int. Cl.[7] .............................................. B65H 81/00
(52) U.S. Cl. ....................... 156/173; 156/155; 156/169; 156/175; 156/293
(58) Field of Search ................................. 156/169, 172, 156/173, 175, 155, 293

(56) References Cited

U.S. PATENT DOCUMENTS

| | | | | |
|---|---|---|---|---|
| 5,439,627 A | * | 8/1995 | De Jager | 264/257 |
| 5,482,257 A | * | 1/1996 | Holcombe et al. | 266/275 |
| 5,586,152 A | * | 12/1996 | Ioki et al. | 428/113 |
| 5,858,486 A | * | 1/1999 | Metter et al. | 428/34.1 |
| 5,904,957 A | | 5/1999 | Christin et al. | |
| 5,928,448 A | * | 7/1999 | Daws | 156/98 |
| 6,489,027 B1 | * | 12/2002 | Kondo et al. | 428/408 |

FOREIGN PATENT DOCUMENTS

| | | | |
|---|---|---|---|
| EP | 913503 A1 | * | 5/1999 |
| JP | 11-255586 A | * | 9/1999 |
| SU | 1699755 A1 | * | 12/1991 |

* cited by examiner

Primary Examiner—Jeff H. Aftergut
(74) Attorney, Agent, or Firm—Weingarten, Schurgin, Gagnebin & Lebovici LLP

(57) ABSTRACT

A composite material bowl 36 comprising fiber reinforcement densified by a matrix is made by winding a yarn on a preform 28 having an axial passage 30 through its bottom, densifying the preform by chemical vapor infiltration, and closing the passage by a plug 34. Prior to densification, the preform can be consolidated. A final chemical vapor infiltration step can be performed after the plug has been put into place.

48 Claims, 3 Drawing Sheets

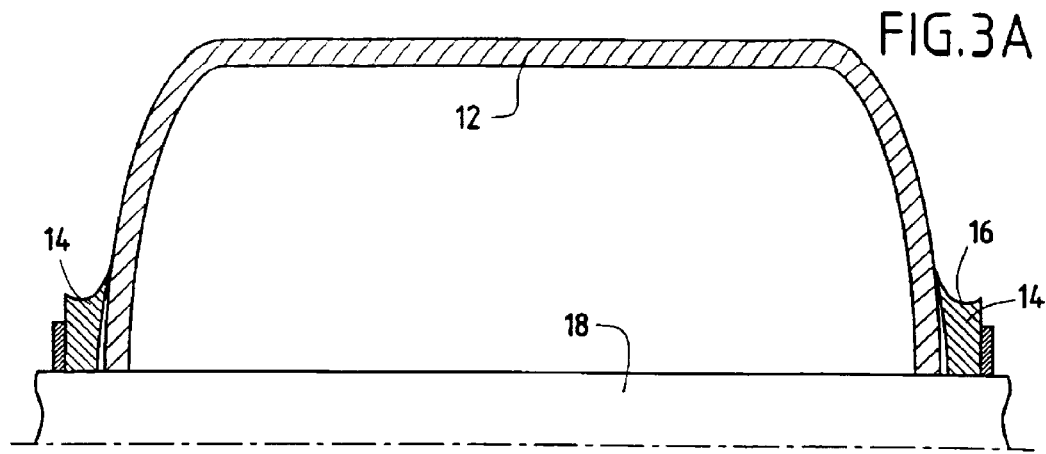
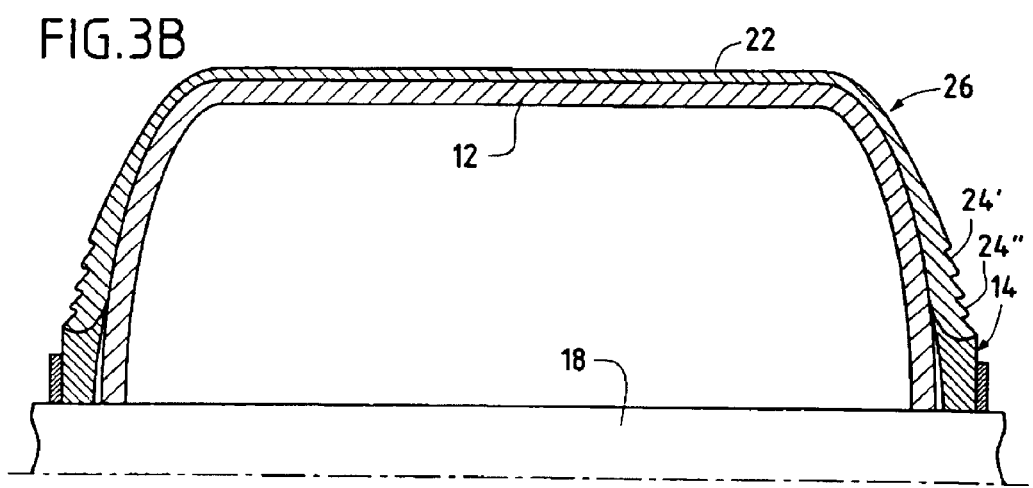
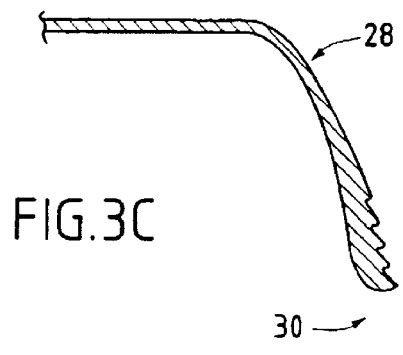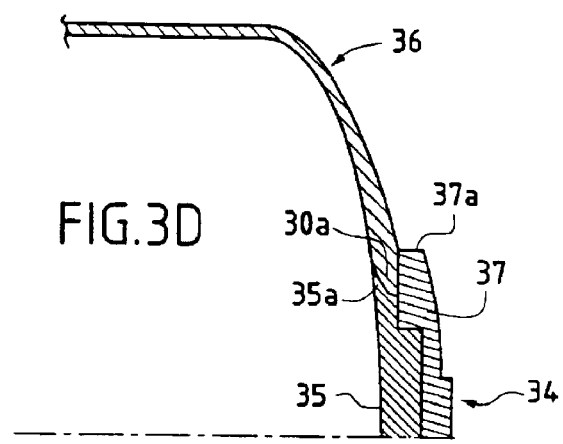

METHOD OF MANUFACTURING A THERMOSTRUCTURAL COMPOSITE MATERIAL BOWL, IN PARTICULAR FOR AN INSTALLATION THAT PRODUCES SILICON SINGLE CRYSTALS

FIELD OF THE INVENTION

The invention relates to thermostructural composite material bowls. A field of application of the invention is more particularly manufacturing bowls for receiving crucibles containing molten metal, such as silicon.

The term "thermostructural composite material" is used to mean a material comprising fiber reinforcement made of refractory fibers, e.g. carbon fibers or ceramic fibers, and densified by a refractory matrix, e.g. of carbon or of ceramics. Carbon/carbon (C/C) composite materials and ceramic matrix composite (CMC) materials are examples of thermostructural composite materials.

BACKGROUND OF THE INVENTION

A well-known method of producing silicon single crystals in particular for manufacturing semiconductor products consists in melting silicon in a crucible, in putting a crystal germ having a desired crystal arrangement into contact with the bath of liquid silicon, so as to initiate solidification of the silicon contained in the crucible with the desired crystal arrangement, and in mechanically withdrawing an ingot of single crystal silicon obtained in this way from the crucible. This method is known as the Czochralski method or as the "CZ" method.

The crucible containing the molten silicon is usually made of quartz ($SiO_2$). The crucible is placed in a bowl which is generally made of graphite, it being understood that proposals have also been made to make the bowl at least in part out of C/C composite materials. The bottom of the bowl stands on a support. For this purpose, the bottom of the bowl must be machined, in particular so as to form a bearing surface for centering purposes and also a support zone. In addition, in the application in question, very high purity requirements make it necessary to use raw materials that are pure, with methods that do not pollute them, and with methods of purification in the finished state or in an intermediate state of bowl manufacture. For carbon-containing materials (such as graphite or C/C composites), methods of purification by high temperature treatment (at more than 2000° C.) under an atmosphere that is inert or reactive (e.g. a halogen) are known and are commonly used.

The pieces of graphite used as bowls are fragile. They are often made up of as a plurality of portions (so-called "petal" architecture) and they cannot retain molten silicon in the event of the crucible leaking. This safety problem becomes more critical with the increasing size of the silicon ingots that are drawn, and thus with the increasing mass of the liquid silicon. Furthermore, graphite bowls are generally of short lifetime while being thick and thus bulky. It is preferable to use C/C composite material pieces which do not present those drawbacks and which, in particular, present better mechanical properties.

The manufacture of a C/C composite material piece, or more generally a piece of thermostructural composite material, usually comprises making a fiber preform having the same shape as the piece that is to be made, and that constitutes the fiber reinforcement of the composite material, and then densifying the preform with the matrix.

Techniques presently in use for making preforms include winding yarns by coiling yarns on a mandrel having a shape that corresponds to the shape of the preform that is to be made, draping which consists in superposing layers or plies of two-dimensional fiber fabric on a former matching the shape of the preform to be made, the superposed plies optionally being bonded together by needling or by stitching, or indeed by three-dimensional weaving or knitting.

The preform can be densified in well-known manner using a liquid process or a gas process. Liquid process densification consists in impregnating the preform—or in pre-impregnating the yarns or plies making it up—with a matrix precursor, e.g. a carbon or ceramic precursor resin, and in transforming the precursor by heat treatment. Gas densification, known as chemical vapor infiltration, consists in placing the preform in an enclosure and in admitting a matrix-precursor gas into the enclosure. Conditions, in particular temperature and pressure conditions, are adjusted so as to enable the gas to diffuse into the core of the pores of the preform, so that on coming into contact with the fibers it forms a deposit of matrix-constituting material thereon by one of the components of the gas decomposing or by a reaction taking place between a plurality of components of the gas.

For pieces that are of relatively complex shape, for example bowl shaped, a particular difficulty lies in making a fiber preform having the right shape.

Another difficulty lies in obtaining densification in a manner that is reasonably simple and fast, in particular for bowls of large dimensions. Unfortunately, in the semiconductor industry, there exists a need for silicon ingots of ever greater diameter, thus requiring crucibles and support bowls to be provided that are of corresponding dimensions.

OBJECT AND SUMMARY OF THE INVENTION

An object of the invention is to propose a method of manufacturing a bowl of thermostructural composite material that makes it possible to overcome the above difficulties, while remaining simple and low in cost.

According to the invention, the method comprises the steps which consist in:

making a bowl preform by winding a yarn, the preform having an axial passage through its bottom;

densifying the bowl preform by chemical vapor infiltration; and closing the passage by means of a plug.

Making a bowl preform with an axial passage presents two advantages. Firstly, the preform can be made by winding yarn without special difficulty. This would not be the case if a complete bowl preform had to be obtained by winding the yarn. In addition, while the preform is being densified by chemical vapor infiltration, the presence of an axial hole enhances flow of the gas and thus enhances densification.

A stiffened or consolidated bowl preform is preferably obtained prior to performing densification by chemical vapor infiltration. In conventional manner, a consolidated bowl preform is made by partial densification of a fiber structure having the desired shape, with the partial densification being at least sufficient to enable the preform to be handled. Partial densification can be performed by a gas process, or it can be performed by a liquid process, using impregnation by means of a precursor of the material that constitutes the matrix of the composite material, and transforming the precursor by heat treatment.

The perform can be consolidated by impregnation with a carbon precursor, e.g. selected from phenolic, furan, epoxy, and polyimide resins, and then transforming the precursor.

A consolidated preform is advantageously made by winding a yarn impregnated with said precursor.

Two consolidated preforms can be made simultaneously on a mandrel of a shape that corresponds to that of two facing bowl portions, with the yarn being wound over the mandrel and with the resulting winding being cut in its middle portion.

Densifying the preform by chemical vapor infiltration makes it possible to obtain a carbon matrix having the continuity necessary to ensure that the installation for producing a silicon single crystal is not polluted with particles that come from the fibers or from resin coke formed on the fibers in order to consolidate the preform. A carbon matrix obtained by chemical vapor infiltration also presents better ability to withstand corrosion on coming into contact with a quartz crucible at high temperature.

Advantageously, the consolidated bowl preform is made from yarn that has no surface treatment, e.g. oxidation under controlled conditions using electrochemical or other means. In particular, the yarn can be a carbon yarn. The absence of the surface treatment which is usually provided on commercially-available yarns for providing surface functions that encourage bonding with organic matrices contributes to obtaining better dimensional stability by avoiding the appearance of internal stresses while making the composite material.

In another feature of the method, the method includes a step which consists in performing a final chemical vapor infiltration step after the passage has been closed by the plug, with the plug itself preferably being made of thermostructural composite material. The final infiltration step can include forming a matrix of a kind that is different from that formed previously during the steps of consolidating the bowl preform and the subsequent densification thereof. Thus, with a carbon densified preform, the final infiltration step can consist in depositing a ceramic matrix, e.g. of silicon carbide. Such an outer matrix material provides the composite material with protection against oxidation.

Advantageously, the bowl is subjected to high temperature purification and stabilization treatment, preferably at a temperature greater than 2200° C. Purification can be performed under an atmosphere of chlorine, as is well known for graphite. It makes it possible to remove impurities that might pollute the silicon when using the bowl as a support for crucibles containing silicon for manufacturing single crystal silicon ingots.

Such purification treatment can be performed on the consolidated bowl preform. The heat treatment then also contributes to avoiding dimensional variations during the subsequent manufacturing processes. Providing the plug closing the bottom of the bowl has also been subjected to purification treatment, performing purification after chemical vapor infiltration need not be necessary.

A protective coating can be formed at least on the inside of the bowl. Such a coating can be of pyrolytic carbon or "pyrocarbon", obtained by chemical vapor deposition, or it can be of ceramic, e.g. silicon carbide (SiC) likewise obtained by chemical vapor infiltration. In a variant, the inside face of the bowl can be provided with a protective layer, e.g. made of C/C composite material.

BRIEF DESCRIPTION OF THE DRAWINGS

The invention will be better understood from the following detailed description given with reference to the accompanying drawings, in which:

FIGS. 3A to 3D are half-section views showing successive steps in making a bowl of composite material using the method of FIG. 2.

DETAILED DESCRIPTION OF IMPLEMENTATIONS

As already mentioned, the field to which the invention applies is more particularly that of making bowls of thermostructural composite material for supporting crucibles in installations that produce single crystal silicon ingots.

Figure 1:
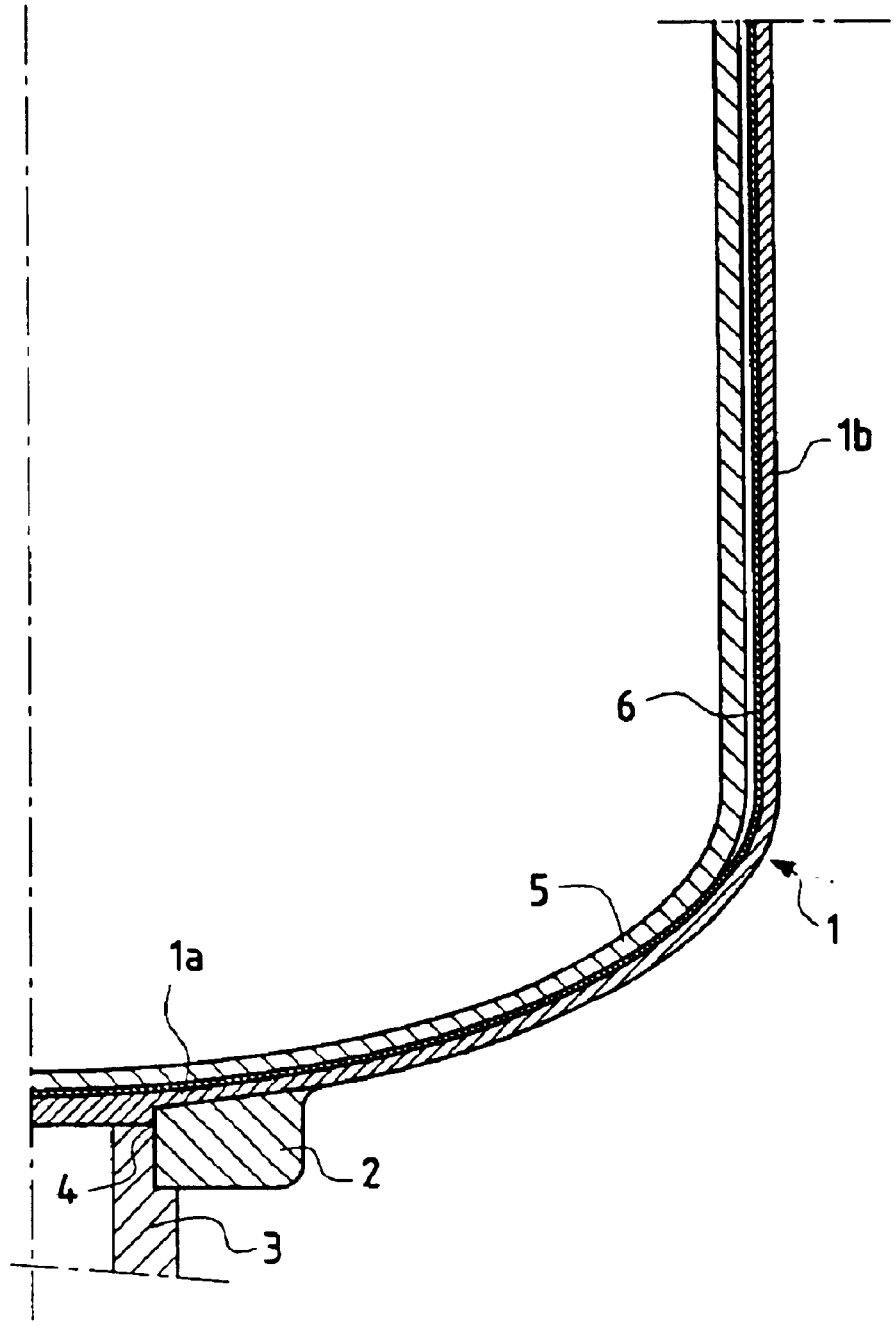
FIG. 1 is a highly diagrammatic half-section view showing a bowl of composite material used as a crucible support in an installation for producing silicon ingots.
Figure 2:
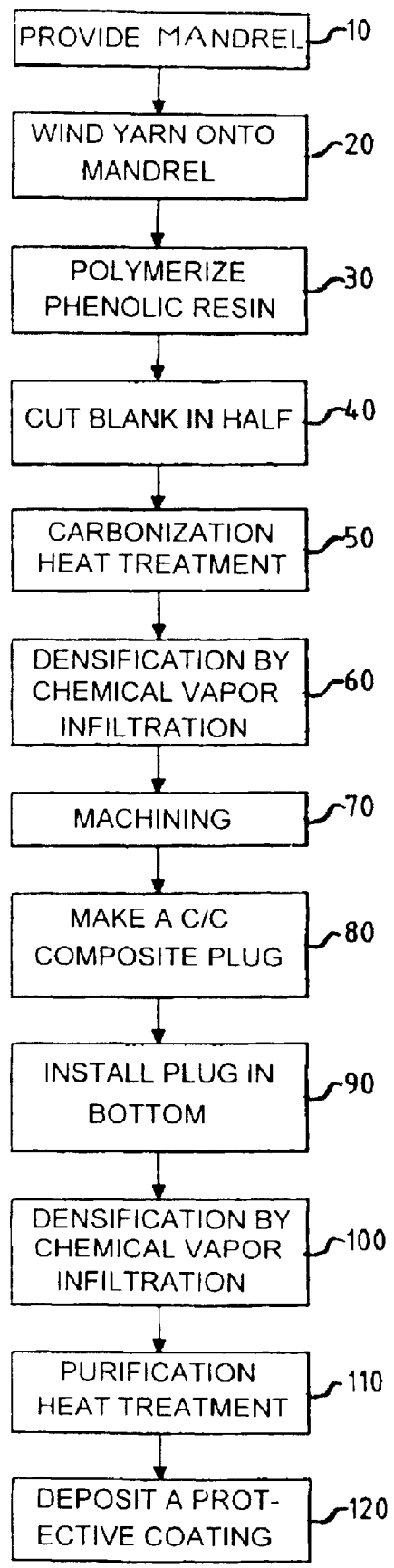
FIG. 2 is a flow chart showing the successive steps in a first implementation of a method in accordance with the invention.

Highly diagrammatic FIG. 1 shows such a bowl of composite material, e.g. C/C composite material supporting a crucible 5 which is usually made of quartz. The bowl 1 stands on an annular support formed with a ring 2 mounted at the end of a shaft 3 having a setback 4 therein. The bowl has a bottom portion 1a and a surround portion 1b, part of which is substantially cylindrical and is connected to the bottom portion via a region of rounded profile. The bottom portion of the bowl 1 is machined so as to form a centering bearing surface corresponding to the setback 4 and a support surface on the ring 2.

After the crucible has been filled with silicon, the assembly is placed in a furnace and the temperature in the furnace is raised to a value which is high enough to cause the silicon to liquefy. At this temperature, the crucible softens and it matches the shape of the bowl. A germ having a desired crystal arrangement is then brought into contact with the bath of silicon and is extracted slowly therefrom, thereby forming a column between the germ and the bath. An ingot is thus drawn at very low speed, and its length can lie in the range 1 meter (m) to 2 m.

That method of manufacturing silicon ingots is well known and does not form part of the invention, such that a more detailed description is not required.

Because thermostructural composite materials have the ability to conserve good mechanical properties and good dimensional stability at high temperatures, they are particularly suitable for making bowls for use in the above application.

The description below relates more particularly to making bowls out of C/C composite materials with carbon fiber reinforcement and a carbon matrix, or at least a matrix that is essentially made of carbon. The invention also covers making bowls out of CMC type composite materials; i.e. having ceramic fiber reinforcement (e.g. made of SiC fibers) and a matrix that is also ceramic (e.g. likewise of SiC), where technologies for making CMCs are well known.

The fiber reinforcement is made from yarns of the kind commercially available but free from any of the surface treatment normally provided to provide surface functions that encourage bonding with an organic matrix when such yarns are used to form fiber/resin type composite materials that are not intended for high temperature applications. The absence of surface functions makes it possible to avoid internal stresses during the process of manufacturing the composite material using the method of the invention.

A first implementation of a method of manufacturing a bowl of composite material is described below with reference to FIGS. 2 and 3A to 3D.

A first step 10 of the method (FIG. 2) consists in providing a mandrel 12 (FIG. 3A). The shape of the mandrel corresponds to the shape of the two parts of the outlines of the bowls that are to be made placed rim-to-rim. At its axial ends, the mandrel is associated with rings 14 which leave an annular gap 16 formed in the outside surfaces thereof at the periphery.

By way of example, the mandrel 12 and the rings 14 can be made of metal. The assembly is mounted and prevented from moving axially on a shaft 18 which passes through central passages of the rings 14 and is connected to a rotary drive motor (not shown).

A second step 20 in the method consists in winding a yarn onto the mandrel 12.

The winding 22 is made using a yarn that is pre-impregnated with a liquid precursor of carbon, e.g. a phenolic resin. At the axial ends of the mandrel, the winding extends far enough to be wound in part around the rings 14 in the vicinity of the recesses 16. Winding is continued so as to build up the thickness desired for the preforms that correspond to the bowl outline portions that are situated rim-to-rim (FIG. 3B). The rings 14 make it easier to stop winding yarn at the axial ends of the winding. The rings 14 can be formed integrally with the mandrel 12. In order to avoid having excessive winding thickness in the vicinity of the end zones of the mandrel where diameter drops off quite quickly, winding can include a plurality of steps 24', 24", . . . , at different diameters.

After winding, the blank 26 formed by the winding 22 and supported by the mandrel 12 is placed in an oven to polymerize the phenolic resin impregnating the yarn of the winding (step 30 of the method).

At the following step 40, the blank 26 is cut in half radially so as to obtain two half-shells 28 which are withdrawn from the mandrel 12 (FIG. 3C), each half-shell having an axial passage 30.

Each half-shell 28 is then subjected to heat treatment (step 50) so as to carbonize the phenolic resin and obtain a consolidated bowl preform having an axial passage 30 through its bottom. The yarn winding is consolidated by being densified with a carbon matrix derived from transforming the phenolic resin. This provides a preform that is densified in part, i.e. that still presents accessible residual porosity, while nevertheless having sufficient strength to be handled.

Thereafter, the purified bowl preform is placed in an enclosure to be subjected to a step of densification by chemical vapor infiltration (step 60 of the method). Densification is performed to fill in, at least in part, the residual porosity in the consolidated preform with pyrolytic carbon. This is achieved in a manner that is well known in itself using a gas containing a hydrocarbon, such as methane or natural gas, constituting a precursor for the carbon.

A plurality of bowl preforms can be densified simultaneously within the same enclosure. To this end, the preforms are placed one above another, in axial alignment with gaps being left between them to allow the gas to flow. A method of chemical vapor infiltration with directed gas flow as described in U.S. Pat. No. 5,904,957 can be used.

The step 60 of chemical vapor infiltration contributes not only to finishing off preform densification, but also to forming a continuous matrix of controlled microstructure that is capable of holding within the material any carbon particles from the fibers or grains of coke from the consolidating resin, such that there is no danger of these particles or grains giving rise to pollution when the bowl is in use. Compared with a carbon matrix as obtained using a liquid process, the carbon matrix obtained by chemical vapor infiltration also provides better resistance to corrosion on contact with a quartz crucible at high temperature.

The following step 70 of the method consists in machining the bottom portion of the bowl so as to fix a plug 34 that closes the passage 30 (FIG. 3D). In the example shown, the plug 34 is made of two pieces 35 and 37, e.g. of C/C composite material (step 80) that have been subjected if necessary to a step of purifying the carbon. The piece 35 is saucer-shaped and its periphery forms a lip 35a that bears against the rim of the passage 30, on the inside of the bowl, while the piece 37 which is also saucer-shaped has a rim 37a which bears against the rim of the passage 30 on the outside. The pieces 35 and 36 can be bonded together by screw fastening, with the piece 35 presenting a projecting central portion which is screwed into a housing in the piece 37. The pieces 35 and 37 clamp the rim 30a of the opening 30. The pieces 35 and 37 constituting the C/C composite material plug 34 can be made by any known method. For example, preforms can be made by superposing two-dimensional plies in the form of carbon fiber disks. The plies which can be woven cloth, for example, are bonded together by needling or by stitching. Thereafter they can be densified by means of a carbon matrix using a liquid process or by chemical vapor infiltration.

After the plug 34 has been installed (step 90) a new and final densification step 100 is performed using chemical vapor infiltration to provide final carbon matrix so as to ensure that the plug 34 is securely assembled to the bottom proton of the preform 28 and so as to finish off densification thereof. A C/C composite material bowl 36 is thus obtained ready for use, possibly after a final stage of machining to finish the bottom and plug portion 34.

The following step 110 of the method consists in purifying the carbon of the resulting bowl when the intended application requires the bowl to be free from impurities. This applies to installations for drawing a silicon single crystal for use in manufacturing semiconductor products, in which the silicon must initially be uncontaminated by any impurities. The carbon can be purified by heat treatment at a temperature that preferably lies in the range 2200° C. to 3000° C., e.g. a temperature equal to about 2400° C., under a non-oxidizing atmosphere, e.g. under an atmosphere of chlorine, and at a pressure that is preferably less than 100 kilopascals (kPa) for example is equal to about 10 kPa. Such heat treatment under chlorine is well known in itself for purifying graphite. The heat treatment also serves to stabilize the dimensions of the consolidated bowl preform. In a variant, purification could be performed once the bowl preform has been consolidated, after step 50. Insofar as the plug 34 has also been subjected to purification, the final purification step after chemical vapor infiltration could then be omitted.

When the bowl is for receiving a quartz crucible, it can be desirable to protect the bowl from erosion caused by a chemical reaction between quartz ($SiO_2$) and the carbon of the bowl at the temperature at which the crucible is used. When drawing a single crystal of silicon, the crucible is raised to a temperature of about 1600° C. at which quartz becomes soft, is subject to creep, and fits closely to the shape of the supporting bowl, while also tending to become reactive.

Protection can be obtained by forming a protective coating (step 120) at least on the inside of the bowl. The protective coating can be of pyrolytic carbon or "pyrocarbon" obtained by chemical vapor deposition, or it can be made of ceramic, e.g. silicon carbide (SiC) likewise obtained by chemical vapor infiltration. In a manner that is well known per se, an SiC deposit can be obtained by chemical vapor deposition using a gas that contains a precursor of SiC, such as methyltrichloro-silane (MTS).

The protective coating can be formed continuously running on from the final densification step 100, prior to any final heat treatment step for purification.

In a variant, the bowl can be protected by interposing an intermediate layer between the bowl and the crucible, said layer matching the shape of the bowl, e.g. being a protective layer of a thermostructural composite such as a C/C composite obtained by densifying a fiber preform constituted by a carbon felt or by two-dimensional plies of carbon fibers.

FIG. 1 shows such a protective layer 6 lining the inside face of the bowl 1. This protective layer is consumable, and the bowl is re-lined periodically.

Although a description above relates to winding a blank suitable for making two bowl blanks simultaneously, the bowl blanks could naturally be made individually.

What is claimed is:

1. A method of manufacturing a bowl of thermostructural composite material formed by fiber reinforcement densified by a matrix, the method comprising:
   making a bowl preform by winding a yarn, the preform having an axial passage through its bottom;
   densifying the bowl preform by chemical vapor infiltration;
   closing the passage by means of a plug made of thermostructural composite material; and
   performing a final chemical vapor infiltration step after the passage has been closed by the plug, the final chemical vapor infiltration step comprising forming a ceramic matrix phase.

2. A method according to claim 1, characterized in that the consolidated bowl preform is made by winding a yarn impregnated by a precursor for said material constituting the matrix, and by transforming the precursor by heat treatment.

3. A method according to claim 2, characterized in that the consolidated bowl preform is made by winding a yarn impregnated by a carbon precursor and by transforming the precursor.

4. A method according to claim 3, characterized in that the carbon precursor in selected from furan, epoxy, and polyimide resins.

5. A method according to claim 3, characterized in that the carbon precursor comprises a phenolic resin.

6. A method according to claim 2, characterized in that two consolidated preforms are made simultaneously by winding a shape on a mandrel where the shape corresponds to that of two bowl outline portions joined rim-to-rim, and by cutting the resulting winding in its middle portion.

7. A method according to claim 1, characterized in that the inside face of the bowl is provided with a protective layer.

8. A method according to claim 7, characterized in that the protective layer is made of a thermostructural composite material.

9. A method according to claim 8, characterized in that a plurality of consolidated bowl preforms is densified simultaneously by chemical vapor infiltration.

10. A method according to claim 1, characterized in that the bowl is subjected to high temperature purification and stabilization treatment.

11. A method according to claim 10, characterized in that the high temperature purification and stabilization treatment is performed on a consolidated bowl preform.

12. A method according to claim 10, characterized in that the purification and stabilization treatment in performed at a temperature greater than 2200° C.

13. A method according to claim 1, characterized in that a protective coating is formed at least on the inside face of the bowl.

14. A method according to claim 13, characterized in that a protective coating is made out of pyrolytic carbon.

15. A method according to claim 13, characterized in that a protective coating is made out of silicon carbide.

16. A method according to claim 1, characterized in that a consolidated bowl preform is made prior to chemical vapor infiltration.

17. A method according to claim 16, characterized in that:
   the consolidated bowl preform is made by winding a yarn impregnated by a carbon precursor selected from phenolic, furan, epoxy, and polyimide resins for said material constituting the matrix, and by transforming the precursor by heat treatment;
   two consolidated preforms are made simultaneously by winding a shape on a mandrel where the shape corresponds to that of two bowl outline portions joined rim-to-rim, and by cutting the resulting winding in its middle portion;
   the bowl preform is made from yarn that has no surface treatment to provide surface functions;
   the bowl preform is made from a carbon yarn;
   the bowl is subjected to high temperature purification and stabilization treatment;
   the high temperature purification and stabilization treatment is performed on the consolidated bowl preform;
   the purification and stabilization treatment is performed at a temperature greater than 2200° C.;
   bowl preform densification is performed by forming a carbon matrix;
   the plug is made in two pieces that are assembled together so as to clamp onto the rim of the axial passage in the preform;
   the passage is closed by a plug made of thermostructural composite material;
   the ceramic matrix phase is made of silicon carbide;
   a protective coating is formed at least on the inside face of the bowl;
   a protective coating is made out of pyrolytic carbon or silicon carbide;
   the inside face of the bowl is provided with a protective layer;
   the protective layer is made of a thermostructural composite material; and
   a plurality of consolidated bowl preforms is densified simultaneously by chemical vapor infiltration.

18. A method according to claim 1, characterized in that the bowl preform is made from yarn that has no surface treatment to provide surface functions.

19. A method according to claim 1, characterized in that the bowl preform is made from a carbon yarn.

20. A method according to claim 1, characterized in that bowl preform densification is performed by forming a carbon matrix.

21. A method according to claim 1, characterized in that the ceramic matrix phase is made of silicon carbide.

22. A method according to claim 1, wherein, in the step of densifying the bowl preform by chemical vapor infiltration, resistance of the densified bowl preform to corrosion by silicon oxide is increased.

23. A method according to claim 1, wherein, in the step of performing the final chemical vapor infiltration, resistance of the bowl preform to corrosion by silicon oxide is increased.

24. A method of manufacturing a bowl of thermostructural composite material formed by fiber reinforcement densified by a matrix, the method comprising:
   making a bowl preform by winding a yarn, the preform having an axial passage through its bottom, the axial passage having a rim;

densifying the bowl preform by chemical vapor infiltration; and closing the passage by means of a plug made of thermostructural composite material, characterized in that the plug has a lip having a shape matching a shape of the rim of the axial passage to interfit with the axial passage and is made in two pieces that are assembled together so as to clamp onto the rim of the axial passage in the preform.

25. A method according to claim 24, characterized in that the consolidated bowl preform is made by winding a yarn impregnated by a precursor for said material constituting the matrix, and by transforming the precursor by heat treatment.

26. A method according to claim 25, characterized in that the consolidated bowl preform is made by winding a yarn impregnated by a carbon precursor and by transforming the precursor.

27. A method according to claim 26, characterized in that the carbon precursor is selected from furan, epoxy, and polyimide resins.

28. A method according to claim 26, characterized in that the carbon precursor comprises a phenolic resin.

29. A method according to claim 25, characterized in that two consolidated preforms are made simultaneously by winding a shape on a mandrel where the shape corresponds to that of two bowl outline portions joined rim-to-rim, and by cutting the resulting winding in its middle portion.

30. A method according to claim 24, characterized in that it includes a step consisting in performing a final chemical vapor infiltration step after the passage has been closed by the plug.

31. A method according to claim 30, characterized in that the final chemical vapor infiltration step comprises forming a ceramic matrix phase.

32. A method according to claim 31, characterized in that the ceramic matrix phase is made of silicon carbide.

33. A method according to claim 30, wherein, in the step of performing the final chemical vapor infiltration, resistance of the bowl preform to corrosion by silicon oxide is increased.

34. A method according to claim 24, characterized in that the inside face of the bowl la provided with a protective layer.

35. A method according to claim 34, characterized in that the protective layer is made of a thermostructural composite material.

36. A method according to claim 35, characterized in that a plurality of consolidated bowl preforms is densified simultaneously by chemical vapor infiltration.

37. A method according to claim 24, characterized in that a protective coating is formed at least on the inside face of the bowl.

38. A method according to claim 37, characterized in that the protective coating is made out of pyrolytic carbon.

39. A method according to claim 37, characterized in that the protective coating is made out of silicon carbide.

40. A method according to claim 24, characterized in that the bowl is subjected to high temperature purification and stabilization treatment.

41. A method according to claim 40, characterized in that the high temperature purification and stabilization treatment is performed on the consolidated bowl preform.

42. A method according to claim 40, characterized in that the purification and stabilization treatment is performed at a temperature greater than 2200° C.

43. A method according to claim 24, characterized in that a consolidated bowl preform is made prior to chemical vapor infiltration.

44. A method according to claim 43, characterized in that:

the consolidated bowl preform is made by winding a yarn impregnated by a carbon precursor selected from phenolic, furan, epoxy, and polyimide resins for said material constituting the matrix, and by transforming the precursor by heat treatment;

two consolidated preforms are made simultaneously by winding a shape on a mandrel where the shape corresponds to that of two bowl outline portions joined rim-to-rim, and by cutting the resulting winding in its middle portion;

the bowl preform is made from yarn that has no surface treatment to provide surface functions;

the bowl preform is made from a carbon yarn;

the bowl is subjected to high temperature purification and stabilization treatment;

the high temperature purification and stabilization treatment is performed on the consolidated bowl preform;

the purification and stabilization treatment is performed at a temperature greater than 2200° C., bowl preform densification is performed by forming a carbon matrix;

it includes a step consisting in performing a final chemical vapor infiltration step after the passage has been closed by the plug;

the final chemical vapor infiltration step comprises forming a ceramic matrix phase;

the ceramic matrix phase is made of silicon carbide;

a protective coating is formed at least on the inside face of the bowl;

the protective coating is made out of pyrolytic carbon or silicon carbides;

the inside face of the bowl is provided with a protective layer;

the protective layer is made of a thermostructural composite material; and a plurality of consolidated bowl preforms is densified simultaneously by chemical vapor infiltration.

45. A method according to claim 24, characterized in that the bowl preform is made from yarn that has no surface treatment to provide surface functions.

46. A method according to claim 24, characterized in that the bowl preform is made from a carbon yarn.

47. A method according to claim 24, characterized in that bowl preform densification is performed by forming a carbon matrix.

48. A method according to claim 24, wherein, in the step of densifying the bowl preform by chemical vapor infiltration, resistance of the densified bowl preform to corrosion by silicon oxide is increased.

* * * * *

UNITED STATES PATENT AND TRADEMARK OFFICE
CERTIFICATE OF CORRECTION

PATENT NO. : 6,783,621 B1
APPLICATION NO. : 09/889860
DATED : August 31, 2004
INVENTOR(S) : Jean-Michel Georges et al.

It is certified that error appears in the above-identified patent and that said Letters Patent is hereby corrected as shown below:

Column 6, line 42 "kilopascals" should read --kiloPascals--.

Signed and Sealed this

Eighth Day of August, 2006

JON W. DUDAS
*Director of the United States Patent and Trademark Office*